(12) United States Patent
Li et al.

(10) Patent No.: US 8,516,347 B1
(45) Date of Patent: Aug. 20, 2013

(54) NON-BINARY LDPC EXTRINSIC CALCULATION UNIT (LECU) FOR ITERATIVE DECODING

(75) Inventors: Shu Li, Sunnyvale, CA (US); Panu Chaichanavong, Sunnyvale, CA (US); Jun Gao, San Jose, CA (US); Naim Siemsen-Schumann, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 288 days.

(21) Appl. No.: 13/113,561

(22) Filed: May 23, 2011

Related U.S. Application Data (60) Provisional application No. 61/347,965, filed on May 25, 2010.

(51) Int. Cl.
  *H03M 13/00* (2006.01)
(52) U.S. Cl.
  USPC .......................... 714/780; 714/778; 714/779

(58) Field of Classification Search
  USPC ................ 714/746, 748, 750, 780, 779, 778, 714/791, 48, 52
  See application file for complete search history.

(56) References Cited

U.S. PATENT DOCUMENTS

| | | | | |
|---|---|---|---|---|
| 7,519,898 B2 * | 4/2009 | Narayanan et al. | ........... | 714/801 |
| 7,657,819 B2 * | 2/2010 | Berkmann et al. | ........... | 714/755 |
| 8,020,078 B2 * | 9/2011 | Richardson | .................... | 714/780 |
| 8,136,006 B2 * | 3/2012 | Park | .............................. | 714/752 |

* cited by examiner

*Primary Examiner* — Christine Tu (57) ABSTRACT

Systems and methods are provided for decoding a vector from a communications channel using a non-binary decoder. The communications channel may correspond to a wired or wireless channel. A message passing process computes R messages corresponding to a variable node of the non-binary decoder. Decoder extrinsic information is formed for the variable node by combining the R messages. The decoder extrinsic information is provided to a soft-detector.

20 Claims, 8 Drawing Sheets

|  | V1 | V2 | V3 | V4 | V5 | V6 | V7 | V8 | V9 | V10 | V11 | V12 |  |
|---|---|---|---|---|---|---|---|---|---|---|---|---|---|
| S1 | 2 | 0 | 0 | 0 | 0 | 1 | 0 | 0 | 0 | 0 | 0 | 0 | |
| S2 | 0 | 2 | 0 | 1 | 0 | 0 | 0 | 0 | 0 | 0 | 0 | 0 | |
| S3 | 0 | 0 | 2 | 0 | 1 | 0 | 0 | 0 | 0 | 0 | 0 | 0 | |
| S4 | 0 | 0 | 0 | 3 | 0 | 0 | 2 | 0 | 0 | 0 | 0 | 1 | |
| S5 | 0 | 0 | 0 | 0 | 3 | 0 | 0 | 2 | 0 | 0 | 1 | 0 | |
| S6 | 0 | 0 | 0 | 0 | 0 | 3 | 0 | 0 | 2 | 1 | 0 | 0 | |
| S7 | 0 | 3 | 0 | 0 | 0 | 0 | 0 | 0 | 1 | 0 | 0 | 1 | |
| S8 | 0 | 0 | 3 | 0 | 0 | 0 | 1 | 1 | 0 | 1 | 0 | 0 | |
| S9 | 3 | 0 | 0 | 0 | 0 | 0 | 0 | 1 | 0 | 0 | 1 | 0 | |

NON-BINARY LDPC EXTRINSIC CALCULATION UNIT (LECU) FOR ITERATIVE DECODING

CROSS REFERENCE TO RELATED APPLICATION

This application claims the benefit under 35 U.S.C. §119(e) of U.S. Provisional Application No. 61/347,965, filed May 25, 2010, which is hereby incorporated by reference herein in its entirety.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

The present disclosure relates generally to data decoding, and more particularly to non-binary iterative decoders for data encoded with a low density parity check (LDPC) encoder.

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy communications or data storage channel. The information may be encoded (by a. LDPC encoder) prior to transmission and then subsequently decoded (by a LDPC decoder) when received. The performance capability of an LDPC coding scheme is often described by the code's performance curve. The performance curve is a plot of signal-to-noise ratios (SNRs) vs. Bit Error Rate (BER), or equivalently Sector Error Rate (SER). LDPC codes are one of the best performing error correcting codes, along with Turbo codes, for use in correcting errors in information transmitted on communication and data storage channels.

Traditional LDPC decoders compute decoder extrinsic information by computing a P message for a given variable node of a LDPC code, and then subtract detector extrinsic information from the P message to obtain the decoder extrinsic information. This process may be repeated for some or all of the variables nodes of the LDPC code. Traditional LDPC decoders store the detector extrinsic information in memory, and load the detector extrinsic information at an appropriate time to form the decoder extrinsic information via subtraction.

SUMMARY

In accordance with an embodiment of the invention, a method is provided for decoding a vector received from a communications channel using a non-binary decoder. R messages corresponding to a variable node of the non-binary decoder are computed using a message passing process. Decoder extrinsic information is formed for the variable node by combining the computed R messages. The decoder extrinsic information is provided to a soft-detector.

In an arrangement, combining the R messages includes linearly weighing the R messages using inverse coefficients from a parity check matrix representation of a code used by the non-binary decoder. In another arrangement, the soft-detector outputs detector extrinsic information and the combining is performed without accessing memory storing the detector extrinsic information. In another arrangement, the non-binary decoder is an LDPC decoder. In an other arrangement, the decoder extrinsic information is formed using a layered decoding approach. In another arrangement, the computing is performed using a Tanner graph representation of an LDPC code.

In another arrangement, the decoder extrinsic information is combined with detector extrinsic information to form updated channel information, which is provided to the non-binary decoder to update the message passing process. In another arrangement, forming the decoder extrinsic information includes converting the decoder extrinsic information from a symbol metric representation to an error metric representation. In another arrangement, forming the decoder extrinsic information includes accessing R memory and Q sign memory, where the R memory and the Q sign memory are stored inside the non-binary decoder.

In accordance with another embodiment of the invention, a system is provided for decoding a vector received from a communications channel. A non-binary decoder is capable of computing R messages corresponding to a variable node of the non-binary decoder using a message passing process, and forming decoder extrinsic information for the variable node by combining the R messages. A soft-detector is capable of receiving the decoder extrinsic information.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

Figure 1:
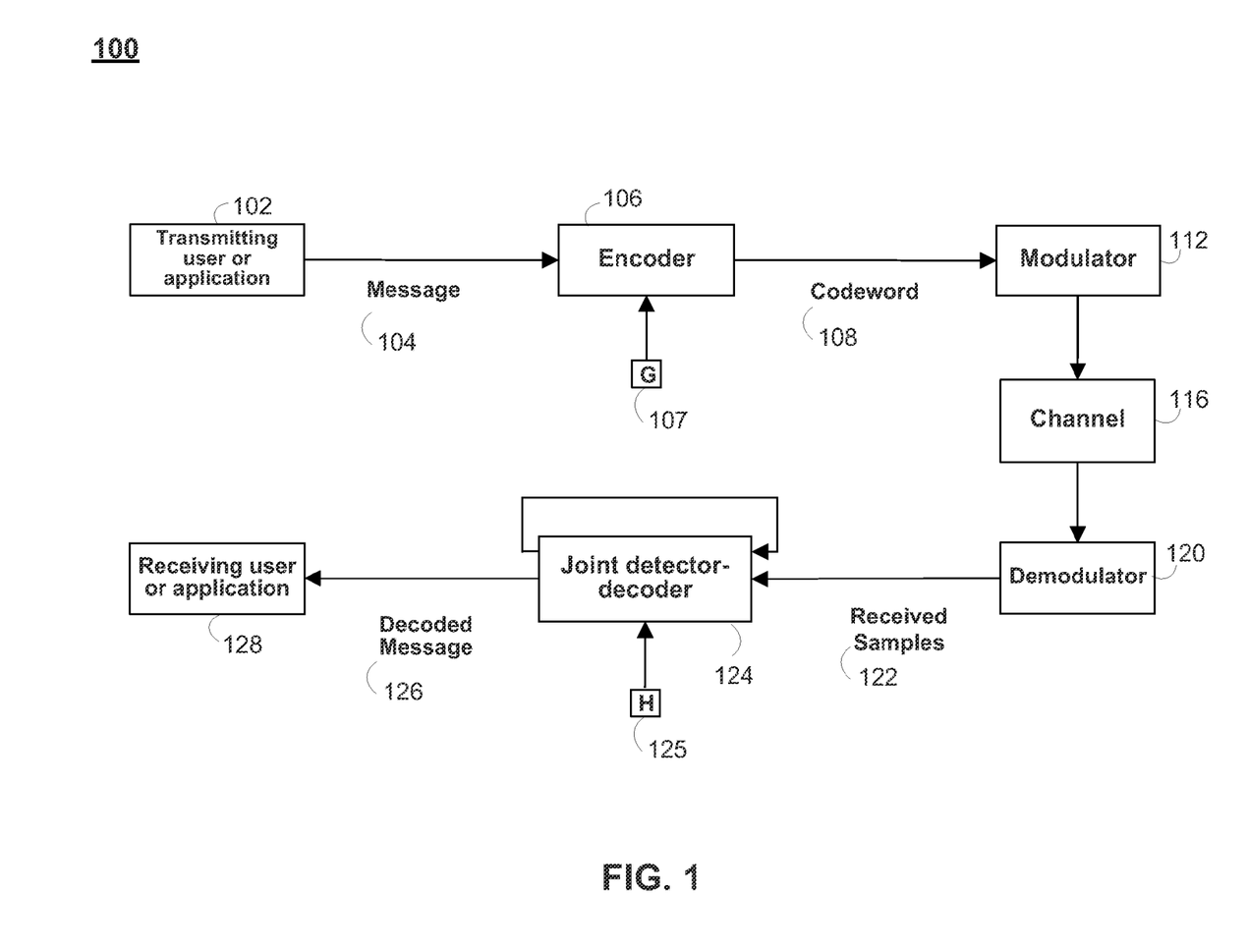
FIG. 1 shows an illustrative communications system employing joint detection and decoding in accordance with some arrangements.

FIG. 1 shows an illustrative communications system employing joint detection and decoding in accordance with some arrangements. Communications system 100 is used to transmit information from transmitting user or application 102 to receiving user or application 128. Transmitting user or application 102 represents an object or entity that produces information. For example, transmitting user or application 102 may correspond to a software program in a computer system or to a component of a wireless communications transmitter in a radio system. Transmitting user or application 102 produces information in the form of a data stream, and the data stream may be represented by a sequence of symbol values that have been pre-processed by, for example, a source encoder (not shown in FIG. 1). The information produced by transmitting user or application 102 may correspond to voice information, video information, financial information, or any other type of information that may be represented in digital or analog form, and the data stream produced by transmitting user or application 102 may be a digital data stream.

Transmitting user or application 102 may segment or otherwise divide the data stream into blocks of a fixed length of k symbols. In particular, message 104, also referred to as m, represents one of these blocks. In particular, message 104 is k symbols in length, where each symbol may be binary data, ternary data, quaternary data, any other suitable type of data, or any suitable combination thereof. Encoder 106 is used to encode message 104 to produce codeword 108. In a preferred arrangement, encoder 106 is an LDPC encoder. However, based on the disclosure and teachings provided herein, it should be clear that encoder 106 may also be a turbo encoder or any other suitable encoder. Codeword 108, also referred to as c, has a length of n symbols, where n>k. Encoder 106 uses generator matrix G 107, also referred to as G for notational convenience, to produce the codeword. For example, encoder 104 may perform one or more matrix operations to convert message 104 into the codeword 108. In an arrangement, encoder 106 produces codeword 108 from message 104 using generator matrix G 107 by the following matrix multiplication $$\underline{c} = G\underline{m}.$$

Codeword 108 may be modulated or otherwise transformed by modulator 112 into a waveform suitable for transmission and/or storage on channel 116. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

Channel 116 refers to the physical medium through which the transmitted waveform passes or is stored on before being recovered at demodulator 120. For example, channel 116 may be a storage channel that represents a magnetic recording medium in a computer system environment or a communications channel that represents the wireless propagation environment in a wireless communications environment. Various characteristics of channel 116 may corrupt data that is communicated or stored thereon. For example, channel 116 may be a non-ideal memoryless channel or a channel with memory. The output of channel 116 is demodulated and processed by demodulator 120 to produce received samples 122. Demodulator 120 may use frequency filters, multiplication and integration by periodic functions, and/or any other suitable demodulation technique to demodulate and/or process the output of channel 116.

Received samples 122 contain information related to codeword 108 and generally corresponds to a corrupted or otherwise altered version of codeword 108 originally output by encoder 106. For example, received samples 122 may contain a preliminary estimate or noisy version of codeword 108, a probability distribution vector of possible values of the codeword produced by encoder 106, or to combinations of these as well other values.

Joint detector-decoder 124 is used to process received samples 122 to produce decoded message 126, which is an estimate of the original data message 104. In an arrangement, joint detector-decoder 124 first computes initial LLR values based on received samples 122, a statistical description of channel 116, and/or a probability distribution on the output of encoder 106. These initial LLR values are then iteratively processed within joint detector-decoder 124. In general, joint detector-decoder 124 may be used to iteratively correct and/or detect errors present in received samples 122, for example, due to transmission through channel 116. In an arrangement, iterative code decoder uses parity check matrix H 125 to produce decoded message 126. Joint detector-decoder 124 may use any suitable decoding algorithm to produce decoded message 126. For example, joint detector-decoder 124 may use decoding algorithms known as belief propagation algorithms with parity check matrix H 125 to produce decoded message 126.

Decoded message 126 is delivered to receiving user or application 128 after being processed by joint detector-decoder 124. Receiving user or application 128 may correspond to the same device or entity as transmitting user or application 102, or receiving user or application 128 may correspond to a different device or entity. Further, receiving user or application 128 may be either co-located or physically separated from transmitting user or application 102. If joint detector-decoder 124 corrects all errors that are induced by channel 116 and other communications effects in communications system 100, then decoded message 126 is a logical replica of message 104. Otherwise, decoded message 126 may differ from the message 104, and joint detector-decoder 124 may declare an error accordingly.

Figure 2:
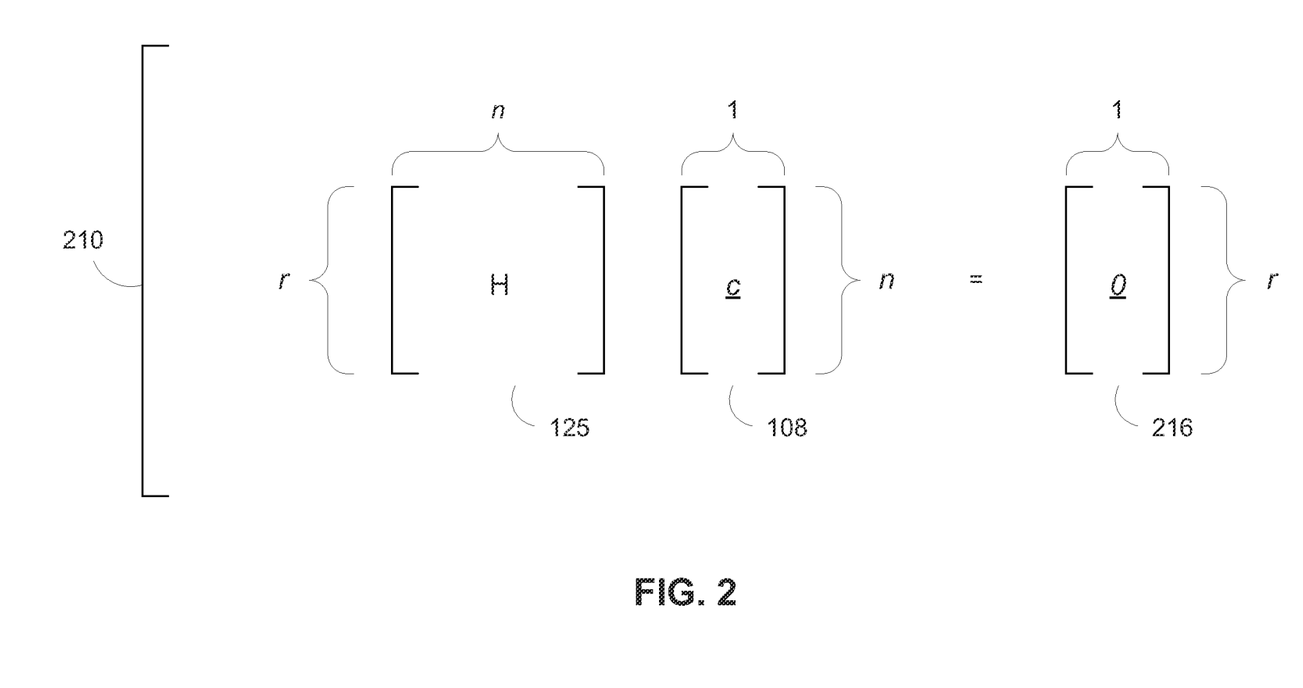
FIG. 2 shows an illustrative example of properties of a codeword using a mathematical vector model in accordance with some arrangements.

FIG. 2 shows an illustrative example of properties of a codeword using a mathematical vector model in accordance with some arrangements. For example, the codes processed by encoder 106 and joint detector-decoder 124 (both of FIG. 1) may be represented by mathematical vector models as depicted in FIG. 2. Equation 210 illustrates parity check matrix H 125 (FIGS. 1 and 2), which may include non-binary elements. As depicted, parity check matrix H 125 (FIGS. 1 and 2) is of size r×n, and corresponds to codewords of length n and syndromes of length r. Syndrome length r satisfies the inequality r s an−k. When codeword 108 (FIGS. 1 and 2) is matrix multiplied by parity check matrix H 125 (FIGS. 1 and 2), the result is zero-vector 216, which is a vector of size r×1 having all elements equal to zero. Parity check matrix H 125 (FIGS. 1 and 2) has a maximum column weight, referred to a $cw_{max}$ defined to be the maximum number of non-zero entries across all columns of parity check matrix H 125 (FIGS. 1 and 2). Parity check matrix H 125 (FIGS. 1 and 2) is not necessarily unique, and may be chosen to be computationally convenient, and/or to decrease the number of errors generated by the message passing algorithm in joint detector-decoder 124 (FIG. 1).

Parity check matrix H 125 (FIGS. 1 and 2) may take on any suitable value. For example, entries of parity check matrix H 125 may belong to GF(q), where q is any suitable integer. In an arrangement, entries of parity check matrix H 125 are non-binary values defined in GF(4), and thus take on four different values. For example, in an arrangement, parity check matrix H 125 (FIGS. 1 and 2) is represented by $$H = \begin{bmatrix} 1 & 2 & 0 & 3 & 0 \\ 0 & 2 & 1 & 0 & 2 \end{bmatrix}$$

and codeword 108 (FIGS. 1 and 2) is represented by c=[2 1 3 0 3]$^T$ (the size of parity check matrix H 125 (FIGS. 1 and 2) is typically much larger than that shown in the example above, and smaller matrix sizes are used for ease of presentation). Addition and multiplication may be performed in GF(4) according to the following tables:

| addition | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

| multiplication | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 | where the result of an addition of an entry in the first row with an entry in the first column is shown in the left table and the result of a multiplication of an entry in the first row with an entry in the first column is shown in the right, table. The result, therefore, of multiplying the above shown parity check matrix H 125 (FIGS. 1 and 2) with the codeword c=[2 1 3 0 3]$^T$ is a zero vector, because 1(2)+2(1)+0(3)+3(0)+0(3)=0 and 0(2)+2(1)+1(3)+0(0)+2(3)=0.

As described above, entries of parity check matrix H 125 may more generally be from GF(q). In general, operations such as addition and multiplication associated with GF(q) codewords may be defined according to finite field arithmetic associated with GF(q). Such operations associated with GF(q) codewords may be referred to as GF(q) operations.

Figure 3:
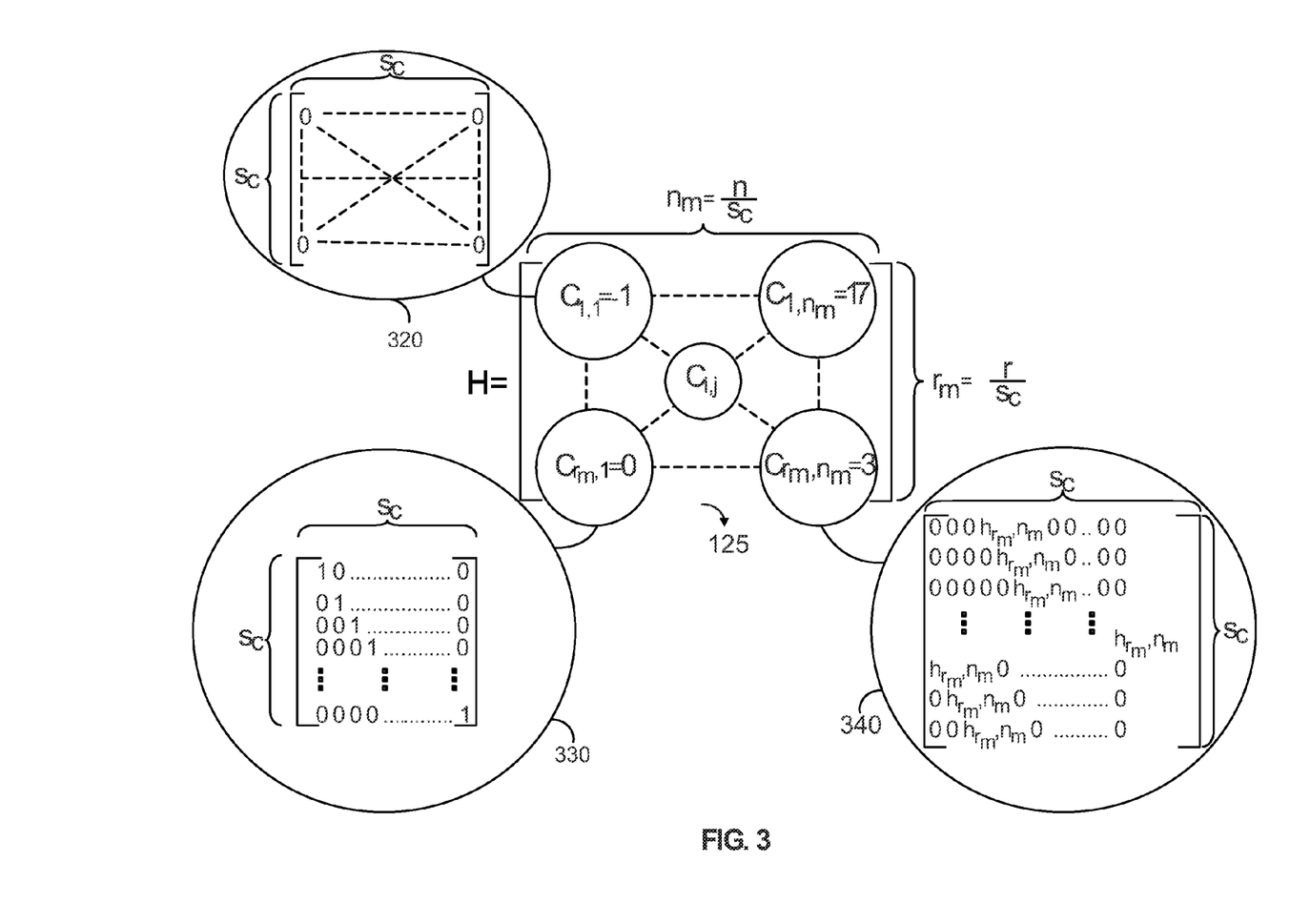
FIG. 3 shows a parity check matrix H in a mother matrix representation in accordance with some arrangements.

FIG. 3 shows parity check matrix H 125 (FIGS. 1-3) in a mother matrix representation in accordance with some arrangements. The mother matrix representation depicted in FIG. 3 may be advantageous in illustrating the structure of parity check matrix H 125 (FIGS. 1-3) when parity check matrix H 125 (FIGS. 1-3) is a large matrix. In the mother matrix representation, there is no requirement to store (or explicitly list) each element of parity check matrix H 125 (FIGS. 1-3). A quasi-cyclic parity check matrix in a mother matrix representation may be made up of circular submatrices known as circulants. Circulant 340 is one such matrix. Circulant 340 is a square matrix, i.e., circulant 340 has the same number of rows as columns. This number is commonly referred to as the circulant size, $S_c$. In addition, circulants have the property that for any given positive integer $C_{i,j} < S_c$, any row/column of the circulant matrix may be cyclically shifted by $C_{i,j}$ positions to obtain another row/column. The value of each non-negative integer in parity check matrix H 125 (FIGS. 1-3) specifies the corresponding circulant submatrix in terms of a shift, $C_{i,j}$, relative to a non-binary identity matrix (e.g., defined by elements which are "0" and elements which are one or more binary or non-binary values, $h_{x,y}$). For example, the number zero represents one type of identity matrix, identity matrix 330 of size $S_c$. The number three represents matrix 340 which is non-binary identity matrix 330 with each row cyclically shifted to the right by three positions (and potentially scaled by a constant amplitude value). As a matter of notation, minus-one denotes the all-zero matrix 320. For brevity, the phrase "non-zero circulant" will be used to refer to a circulant matrix that is not the all-zero matrix. If parity check matrix H 125 (FIGS. 1-3) is of size [r×n], then the size of the mother matrix is [$r_m = r/S_c \times n = n/S_c$], where $S_c$, r, and n are chosen so that $r_m$ and $n_m$ are integers.

The implementation of encoder 106 (FIG. 1) and joint detector-decoder 124 (FIG. 1) may be significantly simplified using a mother matrix representation of parity check matrix H 125 (FIGS. 1-3). One reason for this is that the mother matrix representation provides a simplified storage scheme for parity check matrix H 125 (FIGS. 1-3), since only the first row or column of each circulant matrix needs to be stored in order to generate the entire circulant. If the circulant is sparse (has low row/column weight) then parity check matrix H 125 (FIGS. 1-3) may be stored by simply storing the positions and the values in its first row (or first column). Furthermore by using the mother matrix representation of parity check matrix H 125 (FIGS. 1-3), the storage of the messages used during a decoding of a LDPC vector within an LDPC decoder may be made more compact and parallelization in the encoder/decoder may be achievable with simple shifting operations, since adjacent rows (or adjacent columns) corresponding to the same circulant are cyclic shifts of each other. In addition, for some non-binary quasi-cyclic LDPC codes, encoding and decoding can be further simplified by efficient address generation.

Figure 4:
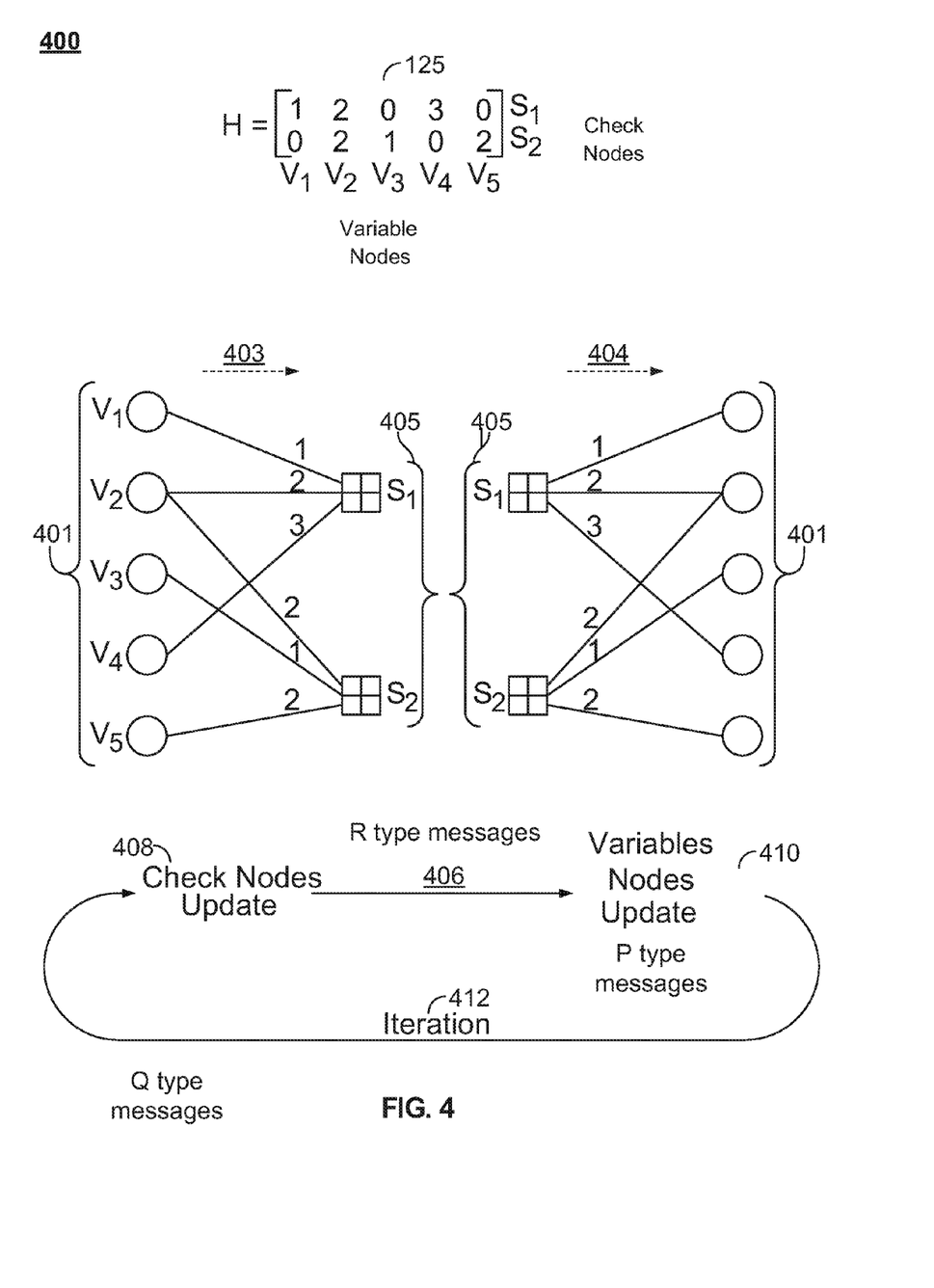
FIG. 4 shows a graphical illustration of an LDPC code, including an illustrative example of the parity check matrix H, in accordance with some arrangements.

FIG. 4 shows a graphical illustration 400 of an LDPC code, including an illustrative example of parity check matrix H 125 (FIGS. 1-4), in accordance with one arrangement. As illustrated in FIG. 4, an LDPC code may be graphically represented by a Tanner graph, i.e., a bipartite graph showing a relationship between codeword symbols (equivalently variables) and parity check equations. The advantages of using a Tanner graph representation of an LDPC code include use of efficient graph-based message-passing algorithms for decoding. There are two types of nodes shown in Tanner graphs 403 and 404. Variable nodes 401 represent each position in codeword 108 (FIGS. 1 and 2) and are denoted by circles. Thus, there are n variable nodes corresponding to the n symbols of codeword 108 (FIGS. 1 and 2). Variable nodes may also be referred to as symbol nodes. Check nodes 405 represent a syndrome (syndrome equation or parity check equation) of a decoded codeword. Thus, there are n−k check nodes. Check nodes are denoted by squares.

Tanner graphs 403 and 404 correspond to parity check matrix H 125 (FIGS. 1-4) as illustrated in FIG. 4. The check nodes and variable nodes of Tanner graphs 403 and 404 correspond to the rows and columns of parity check matrix H 125 (FIGS. 1-4), respectively. In particular, the undirected, weighted edges connecting check nodes with variable nodes correspond to the locations of the non-zero entries of parity check matrix H 125 (FIGS. 1-4). The weight (or, equivalently coefficient) $h_{x,y}$, on each weighted edge corresponds to the value at the (x,y) location of parity check matrix H 125 (FIGS. 1-4). For example, the "1" at the (1,1) location and the "2" at the (1,2) location of parity check matrix H 125 (FIGS. 1-4) indicate that there is an edge of weight one between check node $S_1$ and variable node $V_1$, and that there is an edge of weight two between check node $S_1$ and variable node $V_2$, respectively. Similarly, the lack of an edge between check node $S_2$ and variable node $V_1$ corresponds to the "0" at the (2,1) location of parity check matrix H 125 (FIGS. 1-4). Therefore, if there are $d_v$ non-zero entries in a given column of parity check matrix H 125 (FIGS. 1-4), then there are $d_v$ weighted edges emanating from the variable node corresponding to that column. Equivalently, the variable node corresponding to that column is of a degree $d_v$. Similarly, if there are $d_c$ non-zero entries in a given row of parity check matrix H 125 (FIGS. 1-4), then there are $d_c$ edges emanating from the check node corresponding to that row. Equivalently, the check node corresponding to that row may have a degree of $d_c$.

Check nodes 405 are referred to as either "satisfied" or "unsatisfied," where a satisfied node has a value of zero and an unsatisfied node has a non-zero value. A check node is satisfied (i.e., equal to zero), if the values at the variable nodes connected to the check node, each multiplied by their respective weight, sum to the value zero. In performing this calculation, multiplication and addition are defined with respect to the Galois field from which symbols for the LDPC code (or codeword) are determined. For example, check node $S_2$ of Tanner graphs 403 and 404 is satisfied if the values at $V_2$, $V_3$, and $V_5$, multiplied by the respective weights (i.e., 2, 1, and 2, respectively) on the edges connecting these nodes to $S_2$, sum to zero. Furthermore, when a check node is unsatisfied, at least one of the variable nodes connected to it may be in error (i.e., the symbol or variable associated with the variable node is in error). Thus, the value of the check nodes (or equivalently, the value of the syndrome produced by parity check matrix H 125 (FIGS. 1-4)) may provide a parity check on a received codeword (e.g., received samples 122 of FIG. 1) by a decoder (e.g., joint detector-decoder 124 of FIG. 1), thereby providing error correction capability to a communications system (e.g., communications system 100 of FIG. 1).

Tanner graphs 403 and 404 illustrate an iterative two-step decoding algorithm known as a message passing algorithm 406, where the message passing algorithm is employed by joint detector-decoder 124 of FIG. 1. The message passing algorithm performs several rounds (or iterations) of message updates based on the structure of the Tanner graph associated with parity check matrix H 125 (FIGS. 1-4). The message passing algorithm may be used to decode received samples 122 into decoded message 126 (both of FIG. 1).

The update steps in message passing algorithm 406 may be scheduled in multiple ways. For example, each iteration 412 of message passing algorithm 406 may include processing several check nodes. For example, in the first iteration, a first subset of check nodes 405 (e.g., check nodes $S_1$ and $S_2$) may request that some of variable nodes 401, to which they are connected, send their current messages to these check nodes. Check nodes $S_1$ and $S_2$ may then perform update 408 by carrying out computations based on the messages that they receive and a set of update rules. Then, check nodes $S_1$ and $S_2$ may send their current messages to the variable nodes to which they are connected. For example, check nodes $S_1$ and $S_2$ may send R type messages 407 to the variable nodes, $v_1$ through $v_5$, to which they are connected.

The variable nodes connected to check nodes $S_1$ and $S_2$ (i.e. variable nodes $V_1$, $V_2$, $V_4$ and nodes $V_2$, $V_3$ and $V_5$, respectively) may then perform update 410 by carrying out computations based on the messages that they receive and a set of update rules. Update 410 may produce P type messages 411 based on received R type messages 407 according to any suitable processing algorithm, e.g., according to a linear weighing algorithm. Further, variable nodes may pass Q type messages 413 back to check nodes, e.g. check nodes $S_1$ and $S_2$, to complete an iteration of message passing algorithm 406. In this way, each iteration 412 may include a subset of check nodes 405, not already updated, that may perform update 408 and variable nodes connected to these check nodes may then perform update 410.

Iteration 412 may be repeated until either a received vector has been decoded or until a threshold number of iterations has been reached. The messages that are sent during each step of each iteration of message passing algorithm 406 may depend on the update rules and the scheduling of the update steps.

Prior to the first iteration of message passing algorithm 406, each of the variable nodes 401 of FIG. 4 may receive or compute an initial message, $L_{initial}$ (discussed above) based on or derived from the entries of a received vector (e.g., received samples 122 in FIG. 1). As discussed above, each iteration of message passing algorithm 406 may include two steps. In the first step, check nodes are updated and in the second step variable nodes are updated. In an arrangement, this process is repeated until a zero syndrome is achieved or until a threshold number of iterations has been performed.

For example, in the first step, a group of variable nodes within the set of variable nodes 401 may send their current messages to a group of check nodes (e.g. to be processed in a first layer of message passing decoding) within the set of check nodes 405 to which they are connected. These messages may each be appropriately weighted (i.e., multiplied) by the respective weight on the edge connecting the particular one of variable nodes 401 with a particular one of the check nodes to produce a weighted message. The group of check nodes may then perform update 408 by carrying out computations based on the weighted messages that they receive and a set of update rules. For example, these check nodes may each receive $d_c$ messages, each from a different variable node to which it is connected. Each message sent from the group of variable nodes to the group of check nodes, and appropriately weighted, may be labeled as a Q type message. Each Q type message may be in a metric vector form, a LLRV form, or any other suitable form. An a-posteriori probability (APP) message computed for any node in the group of variable nodes, and appropriately weighted, may be labeled as a P type message. Each P type message may be in a metric vector form or a LLRV form. Q type or P type messages may be stored in the LDPC decoder's memory.

For example, messages sent from variable nodes to check nodes may be labeled $Q_1$ through $Q_{d_c}$. The group of check nodes may then update by computing each entry in a R type message (a vector) using each entry in the Q type message (a vector) and a min approximation. In one arrangement, using all, of the Q type messages it received, each of the check nodes in the group of check nodes may compute a R type message based on the equation $$\tanh\left(\frac{R}{2}\right) = \prod_{k=1}^{d_c-1} \tanh\left(\frac{Q_k}{2}\right),$$

which may be approximated using min approximation $$R = \min(Q_k, \ldots, Q_{d_c-1}) \prod_{k=1}^{d_c-1} \text{sign}(Q_k).$$

In other arrangements, R type messages may be calculated using other equations/formulas (e.g., other min approximations) based on Q and/or P type messages. For example, decoders, as described in the present disclosure, may make use of any equation/formula to compute R type messages. In this case, the minimum may be with respect to the entries (equivalently components) of the Q type messages. The $Q_k$ messages (i.e. a number k of Q type messages) may be read directly from the memory of the decoder or may be reconstructed. The $Q_k$ messages may be reconstructed from the $P_k$ messages (i.e. a number k of P type messages) and the previous R type messages that may be read from the memory of the LDPC decoder. Therefore, the min approximation may be computed using P type messages in order to derive R type messages. Each R type message may be in a metric vector form or a LLRV form. The newly computed R messages may be sent to each of the variable nodes to which the check node is connected.

In the second step, a group of check nodes within the set of check nodes 405 may send their current message to a group of variable nodes within the set of variable nodes 401 to which they are connected. The group of variable nodes may then perform update 410 by carrying out computations based on the messages that they receive and a set of update rules. For example, these variable nodes may each receive $d_v$ messages each from different check nodes to which it is connected. Each message sent from the group of check nodes to the group of variable nodes may be labeled as a R type message.

For example, the messages sent from check nodes to a variable node may be labeled $R_1$ through $R_{d_v}$. The group of variable nodes may then update by computing a Q type message using each R type message it received. Specifically, using its initial message, and each of the R type messages received, each variable node of the group of variable nodes may compute a Q type message based on the equation $$Q = L_{initial} + \sum_{j=1}^{d_v-1} R_j.$$

As used herein, $L_{initial}$ refers to both the initial message for a particular variable node (in LLRV form, as shown, in metric vector form, or in any other suitable form), and to subsequent messages sent to a decoder (e.g., a decoder element within joint detector-decoder 124 of FIG. 1) by, for example, a channel detector.

Similarly, message update steps may be performed to compute a P type message (also known as an a-posteriori probability (APP) message). Using its initial messages and each of the R type messages received, each variable node of the group of variable nodes may compute a P type message based on the equation:

$$P = L_{initial} + \sum_{j=1}^{d_v} R_j.$$

In addition, each variable node of the group of variable nodes may also compute an extrinsic ($LLR_{EXT}$) message based on the equations:

$$LLR_{APP}(v) = L_{initial} + \sum_{j=1}^{d_v} R_j h_j,$$

where $h_j$ denotes the inverse of the coefficient of the edge connecting variable node v with check node j, and $LLR_{EXT}(v)$ $LLR_{APP}(v) - L_{initial}$. Some or all of these newly computed messages may be sent to each of the check nodes to which the variable node is connected.

The design of message passing algorithm 406 may be modified to decode a QC-LDPC code in a more efficient manner. In particular, the schedule of update steps in message passing algorithm 406 may be altered to exploit properties of parity check matrix H 125 (FIGS. 1-4). For example, in an arrangement, parity check matrix H 125 (FIGS. 1-4) has a quasi-cyclic structure.

Figure 5:
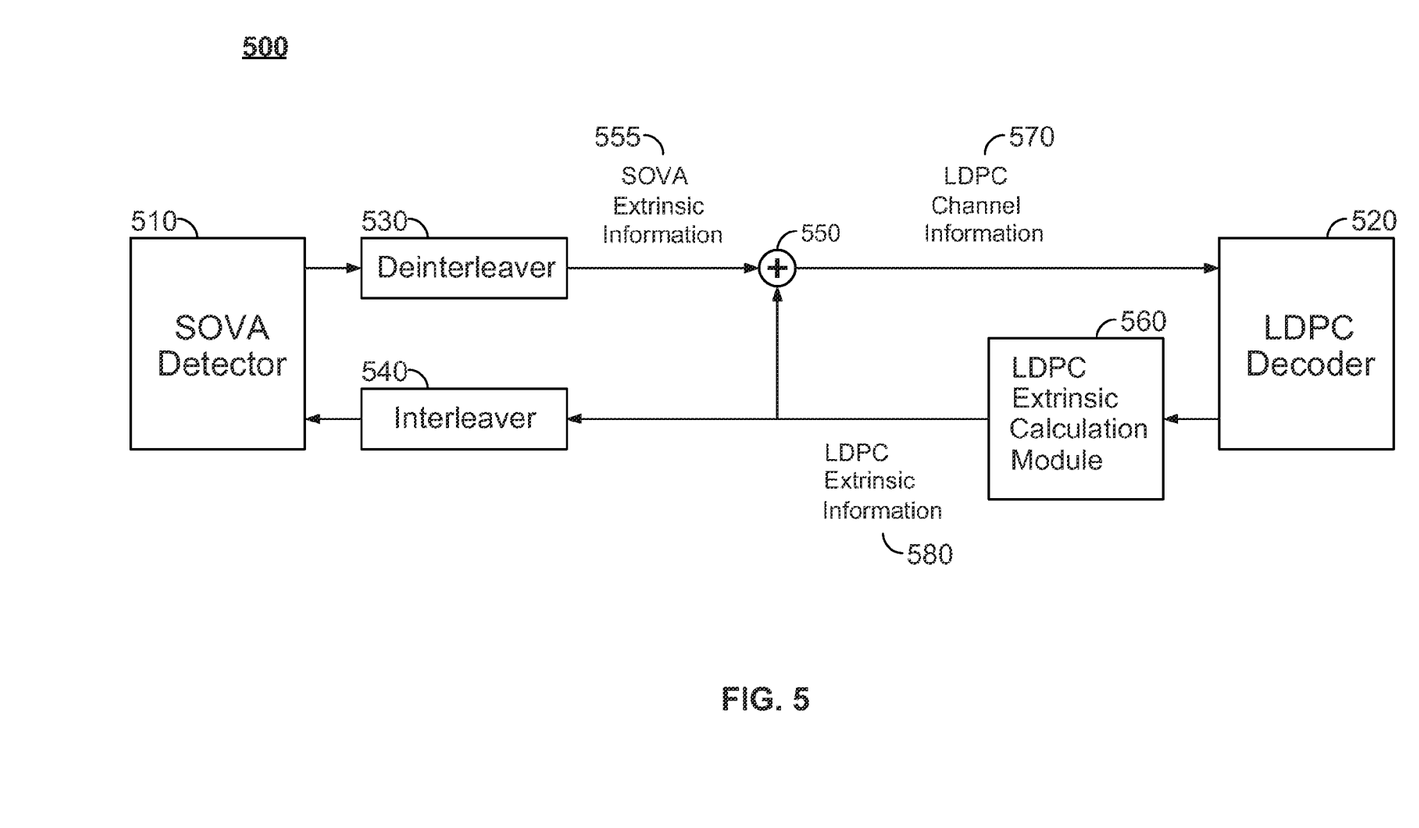
FIG. 5 shows an illustrative detection and decoding system for a communications system in accordance with some arrangements.

FIG. 5 shows an illustrative detection and decoding system for a communications system in accordance with some arrangements. Detector-decoder 500 may correspond to a more detailed embodiment of joint detector-decoder 124 (FIG. 1). Detector-decoder 500 produces decoded message 126 (FIG. 1) from received samples 122 (FIG. 1) by iterating between a soft channel decoder and soft code detector as shown in FIG. 5. In particular, detector-decoder 500 employs Soft Output Viterbi Algorithm (SOVA) detector 510 as soft detector and LDPC decoder 520 as a soft decoder.

During a given (outer) iteration of detector-decoder 500, the message passed from SOVA detector 510 to LDPC decoder 520 is referred to as SOVA extrinsic information 555, and the message passed from LDPC decoder 520 to SOVA detector 510 is referred to as LDPC extrinsic information 580. As depicted in FIG. 5, LDPC decoder forms updated channel information, referred to as LDPC channel information 570, by adding the SOVA extrinsic information 555 and LDPC extrinsic information 580 using adder 550. LDPC channel information 570 is input to LDPC decoder 520 and used to perform (inner) iterations of a decoding process, as described by FIG. 4, above. At the end of an inner iteration of LDPC decoder 520, the values stored in each check node are preserved (e.g., stored) for future access.

As shown in FIG. 5, SOVA detector 510 receives LDPC extrinsic information 580 after it passes through interleaver 540, and SOVA detector 510 applies its output to deinterleaver 530 to produce SOVA extrinsic information 555. In an arrangement, deinterleaver 530 performs an inverse mapping of the interleaving operation of interleaver 540. For example, in an arrangement, interleaver 540 maps LDPC extrinsic information 580 to a particular sequence designed to reduce correlation among the samples of an interleaved version of LDPC extrinsic information 580, while deinterleaver 530 recovers the original sequence order in LDPC domain. Thus, SOVA detector 510 receives and processes an interleaved version of LDPC extrinsic information 580, output updated soft information, which is processed by deinterleaver 530 to produce SOVA extrinsic information 555. Similarly, LDPC decoder 520 receives the updated channel information, in the form of LDPC channel information 570, uses the updated channel information with information stored at the variable nodes of LDPC decoder 520 to perform an (inner) iteration of LDPC decoding.

LDPC extrinsic calculation module 560 determines LDPC extrinsic information 580. In particular, LDPC extrinsic information is input, to interleaver 540, which reduces and/or removes correlation present in LDPC extrinsic information 580 before passing the interleaved data to SOVA detector 510. Further, LDPC extrinsic information is input, to adder 550, which adds deinterleaved output from SOVA detector 510, referred to as SOVA extrinsic information 555, with the LDPC extrinsic information 580 to produce LDPC channel information 570. LDPC channel information 570 represents updated LLR values (i.e., updated channel information) and is input to LDPC decoder 520. This iterative processing of LLR values between SOVA detector 510 and LDPC decoder

520 may continue until a stopping criterion has been met. Thus, communications system 100 (FIG. 1) may iteratively decode the output of demodulator 120 (FIG. 1) as described.

LDPC extrinsic calculation module 560 produces LDPC extrinsic information 580 from information stored within LDPC decoder 520 after the end of an (inner) iteration of LDPC decoder 520. In particular, some or all of the variable nodes of LDPC decoder have computed the quantity $$LLR_{APP}(v) = L_{initial} + \sum_{j=1}^{d_v} R_j h_j,$$

where, as described above, v denotes a variable node index, $L_{initial}$ refers to SOVA extrinsic information 555, and terms $R_1$ through $R_{d_v}$ are R terms. At the end of an (inner) iteration of LDPC decoder 520, LDPC extrinsic calculation module 560 produces the quantity $$LE(v) = \sum_{j=1}^{d_v} R_j h_j,$$

where $h_j$ denotes the inverse of the coefficient of the edge connecting variable node v with check node j. The coefficient $h_j$ may be derived from the $(j,v)^{th}$ element of the parity check matrix corresponding to LDPC decoder 520. For example, in an arrangement, parity check matrix H 125 (FIGS. 1-4) is the parity check matrix of LDPC decoder 520, and the coefficient $h_j$ is derived from the $(j,v)^{th}$ element of the parity check matrix H 125 (FIGS. 1-4). In an arrangement, LDPC extrinsic calculation module 560 determines LE(v) without relying on memory storage for the term $L_{initial}$ (e.g., without subtracting the quantity $L_{initial}$ from $LLR_{APP}(v)$).

Figure 6:
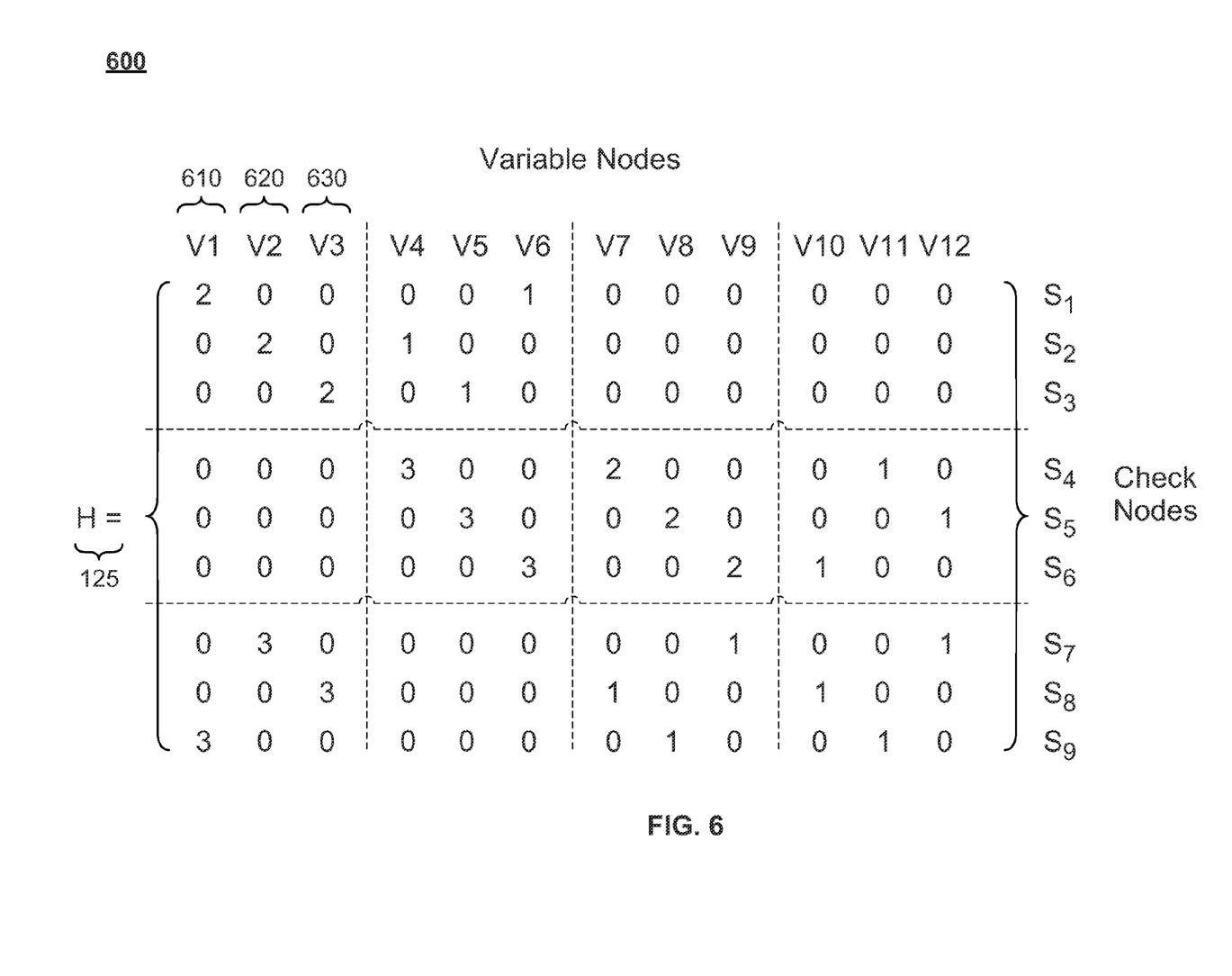
FIG. 6 illustrates a circulant-based technique for accumulating a quantity LE(v) for each variable node in an LDPC decoder according to some arrangements.

FIG. 6 illustrates a circulant-based technique for accumulating a quantity LE(v) for each variable node in an LDPC decoder according to some arrangements. In particular, graphical illustration 600 depicts parity check matrix H 125 (FIGS. 1-4 and 6), which corresponds to 12 variable nodes, referred to by the indicators $V_1$ through $V_{12}$, and nine check nodes, referred to by the indicators $S_1$ through $S_9$.

To accumulate the message LV(1), corresponding to the first variable node (i.e., column 610), the individual R message corresponding to each non-zero entry in column 610 is extracted. In particular, values $R_1$ and $R_9$, corresponding to elements in the (1,1) and (9,1) positions of parity check matrix H 125 (FIGS. 1-4 and 6), respectively, are extracted. Second, the extracted R messages are shifted in memory to preserve alignment with the connections between the variables nodes and check nodes of parity check matrix H 125 (FIGS. 1-4 and 6) in memory. Third, the R values are weighed according to the inverse of their coefficient values in parity check matrix H 125 (FIGS. 1-4 and 6). That is, since the value $R_1$ corresponds to a coefficient value of 2, the value $R_1$ is weighed by a factor of 3 (i.e., the inverse of 2 in GF(4)) in performing accumulation. Similarly, the value of $R_9$ is weighed by a factor of 2 in performing accumulation. Thus, the accumulated value corresponding to the variable node $v_1$ is given by $$LE(1) = R_1 h_1 + R_9 h_9 = R_1 \times 3 + R_9 \times 2.$$

Similarly, it can be determined that $$LE(2) = R_2 \times 3 + R_7 \times 2, \text{ and}$$

$$LE(3) = R_3 \times 3 + R_8 \times 2.$$

In similar fashion, LE(4) through L(12) may be calculated. As described previously, entries of parity check matrix H 125 may more generally be from GF(q) in which case the arithmetic operations described above would be performed in GF(q).

Figure 7:
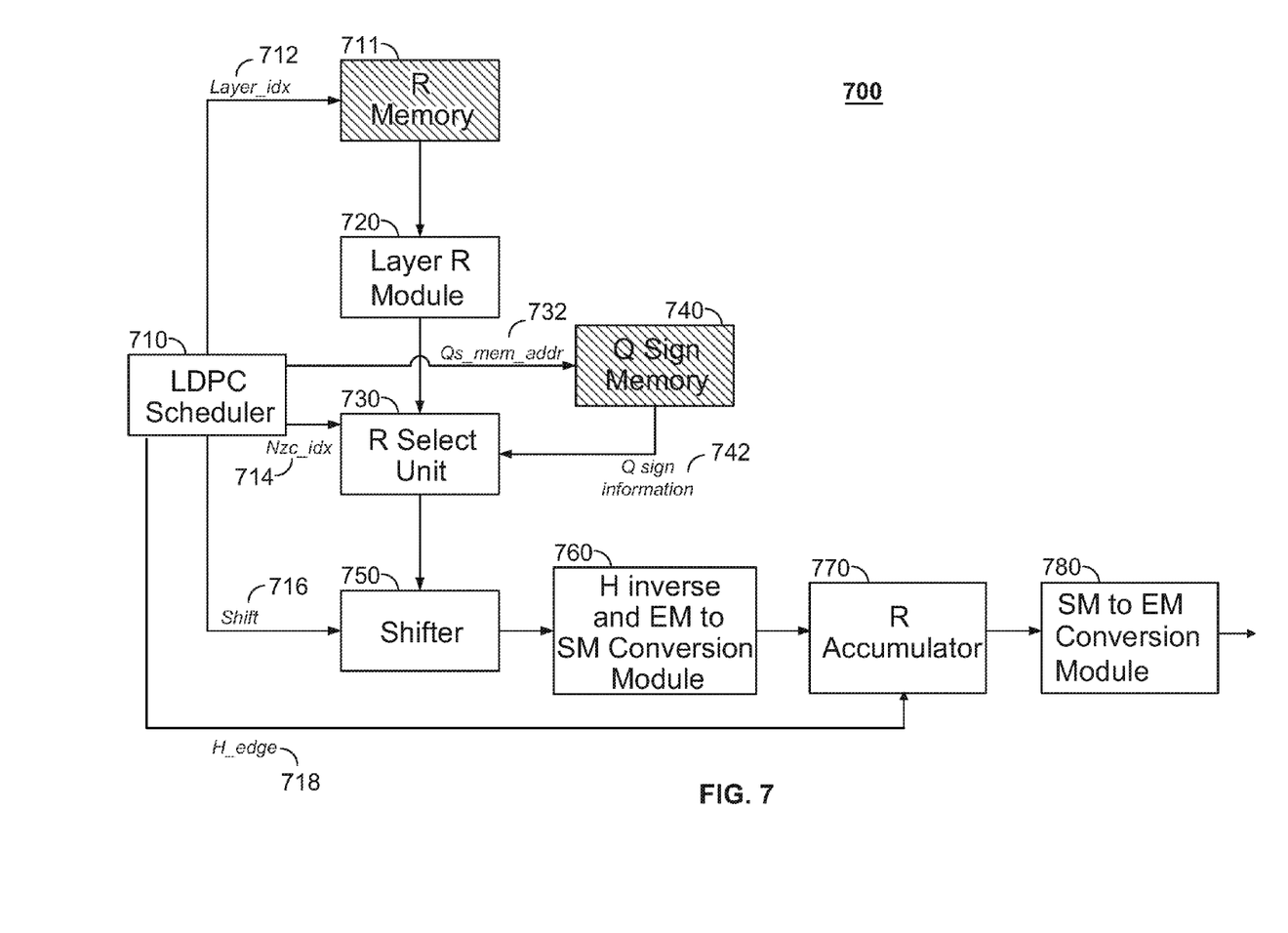
FIG. 7 shows a structure of an LDPC extrinsic calculation module in accordance with some arrangements.

FIG. 7 shows a structure of an LDPC extrinsic calculation module in accordance with some arrangements. LDPC extrinsic calculation module 700 represents a more detailed version of LDPC extrinsic calculation module 560 (FIG. 5) in accordance with an arrangement. LDPC extrinsic calculation module 560 is used to determine the quantity $$LE(v) = \sum_{j=1}^{d_v} R_j h_j,$$

for each value of v corresponding to a variable node in a Tanner graph representation of an LDPC code. Further, LDPC extrinsic calculation module 700 calculates the quantities LE(v) without relying on memory for storage of the term $L_{initial}$ (e.g., LDPC extrinsic calculation module 700 does not subtract the quantity from $LLR_{APP}(v)$ to obtain the value LE(v)).

LDPC extrinsic calculation module 700 includes LDPC scheduler 710 which includes memory for storing some or all of the following information for each layer of parity check matrix H 125 (FIGS. 1-4 and 6):

H_edge 718—storage of one or more Tanner graph coefficient values representing the weights of corresponding variable-to-check node edges, i.e., one or more values of the matrix entries of parity check matrix H 125 (FIGS. 1-4 and 6). In an arrangement, each stored value of h_edge 718 is two bits in length.

Nzc_idx 714—storage of an index value identifying a given circulant in a mother matrix representation of parity check matrix H 125 (FIGS. 1-4 and 6). The values of nzc_idx are not necessarily enumerated from left to right (and/or top to bottom) across circulant submatrices in FIG. 6. Rather, the value of nzc_idx may correspond to any particular circulant submatrix in FIG. 6 according to a mapping determined ahead of time. The values of nzc_idx and layer_idx uniquely specify a non-zero circulant matrix within the matrix.

For example, in graphical illustration 600 (FIG. 6) depicting parity check matrix H 125 (FIGS. 1-4 and 6), in an arrangement, the circulant matrix corresponding to variables nodes $V_1$-$V_3$ and check nodes $S_1$-$S_3$ may correspond to nzc_idx=0 and the circulant matrix corresponding to variables nodes $V_4$-$V_6$ and check nodes $S_1$-$S_3$ may correspond to nzc_idx=1. Further, the circulant matrix corresponding by variable nodes $V_4$-$V_6$ and check nodes $S_4 S_6$, variables nodes $V_7$-$V_9$ and check nodes $S_4$-$S_6$, and variables nodes $V_{10}$-$V_{12}$ and check nodes $S_4$-$S_6$ may correspond to nzc_idx values of 1, 0, and 2, respectively. The maximum value of nzc_idx depends on the degree $d_c$ (defined previously) and determines the bit width of nzc_idx. In an arrangement, each stored index value of nzc_idx 714 is four bits in length. In general, the bit-length of each coefficient value will depend on the size of a mother matrix representation of parity check matrix H 125 (FIGS. 1-4 and 6) and/or the size of each circulant matrix within the mother matrix representation.

Qs_mem_addr 732—storage of a read address for Q sign memory, where the read address is used by LDPC scheduler 710 to retrieve the Q sign used by R select unit 730 to determine a sign portion of an R message. In an arrangement, each stored value of qs_mem_addr 732 is 10 bits in length.

Shift 716—storage of a value of an absolute shift between an identify matrix and the cyclically-shifted circulant matrix corresponding to the index nzc_idx 714. The value shift describes the amount of shifting necessary to align variables nodes and check nodes corresponding to the selected circulant matrix of parity check matrix H 125 (FIGS. 1-4 and 6). In an arrangement, each stored value of shift 716 is five bits in length.

Layer_idx 712—stores a value of a read address of R memory, and denotes the location of component wise R information as well as an accumulated sign for one or more check nodes. In an arrangement, each stored value of layer_idx 712 is seven bits in length.

LDPC scheduler 710 stores and/or uses some or all of this information to calculate instructions necessary for generating the quantity $$LE(v) = \sum_{j=1}^{d_v} R_j h_j,$$

for one or more variable nodes by sending appropriate messages to some or all of the other components depicted in FIG. 7. In an arrangement, some or all of the information components described above are loaded into LDPC scheduler 710 during a chip power up phase from non-volatile memory, and the information may be configured once per power-up cycle.

In an arrangement, LDPC extrinsic calculation module 700 may decode one layer of parity check matrix H 125 (FIGS. 1-4 and 6) each clock cycle. In this arrangement, LDPC scheduler 710 sends the value of layer_idx 712 corresponding to a current layer to be decoded to R memory 711 during a given clock cycle, where R memory 711 represents memory stored within LDPC decoder 520 (FIG. 5). Based on layer_idx 712, R memory 711 reads out component-wise R information that will be used in layer R module 720. As denoted by cross-hatched shading in FIG. 7, R memory 711 is stored within LDPC decoder 520 (FIG. 5). In particular, layer R module 720 receives component-wise R information and computes a general R message for each layer.

Further, LDPC scheduler 710 sends (or has previously sent) the value qs_mem_addr 732 to Q sign memory 740, where, as denoted by cross-hatched shading in FIG. 7, Q sign memory 740 is stored within LDPC decoder 520 (FIG. 5). In response to receiving qs_mem_addr 732, Q sign memory 740 outputs Q sign information corresponding to the requested memory address. LDPC extrinsic calculation module 700 passes the general R message computed at layer R module 720, the Q sign information computed at Q sign memory 740, and the value nzc_idx 714 to R select unit 730. R select unit 730 uses these received quantities to generate an R message corresponding each variable node, where each generated R message contains both a sign value and an amplitude.

LDPC scheduler 710 sends the value shift 716 to shifter 750, which uses the value shift 716 to align the check nodes and variables nodes of the layer of parity check matrix H 125 (FIGS. 1-4 and 6) that is currently being processed. After this shifting operation is performed by shifter 750, the (shifted) R values corresponding to each variable node are denoted $R_j$, as previously introduced above, for $1<=j<=d_v$.

LDPC scheduler 710 passes the value of the output of shifter 750 to H inverse and error metric format (EM) to symbol metric format (SM) conversion module 760, where H inverse represents the inverse of the edge coefficient between a corresponding check and variable nodes (as previously described). In an arrangement, the symbol error metric format (or representation) of an element can be represented in the form c−log(P(x)), where c is a suitable constant, and where P(x) denotes a probability associated with the $x^{th}$ element, for $1<=x<=N$. In an arrangement, c is chosen large enough so that each entry in a symbol error vector is unsigned.

H inverse and EM to SM conversion module 760 also receives a value h_edge 718 from LDPC scheduler 710 and processes the received value h_edge 718 with the output of shifter 750 in GF(q) (e.g., in GF(4)). LDPC scheduler 710 transfers corresponding R messages to a variable node side, and changes from an error metric representation of data received from shifter 750 to a symbol metric representation of the data. In particular, the symbol metric representation of data facilitates performing addition in GF(q) (e.g., GF(4)).

LDPC scheduler 710 passes the value of the output of H inverse and EM to SM conversion module 760 to R accumulator 770. R accumulator 770 then performs a circulant-based accumulation of R messages in the circulant column corresponding to the current layer that is being processed. For example, R accumulator 770 may accumulate LE(v) for each variable node in an LDPC decoder, e.g., LDPC decoder 520 (FIG. 5). In general, the amount of processing required by R accumulator 770 depends on the column weight of parity check matrix H 125 (FIGS. 1-4 and 6) in the column corresponding to the layer of parity check matrix H 125 (FIGS. 1-4 and 6) currently being processed by LDPC scheduler 710. In an arrangement, R accumulator 770 performs the circulant-based accumulation of R messages using a technique similar or identical to that illustrated by graphical illustration 600 (FIG. 6). R accumulator 770 outputs the quantity $$LE(v) = \sum_{j=1}^{d_v} R_j h_j,$$

in symbol metric form.

Next, LDPC scheduler 710 passes the output of R accumulator 770 to SM to EM conversion module 780. SM to EM conversion module 780 converts the values of LE(v) for each variable node from the symbol metric representation to the error metric representation. This may be advantageous for storing and transferring the LE(v) values, as the error metric representation of LE(v) is generally shorter than the symbol metric representation of LE(v).

Figure 8A:
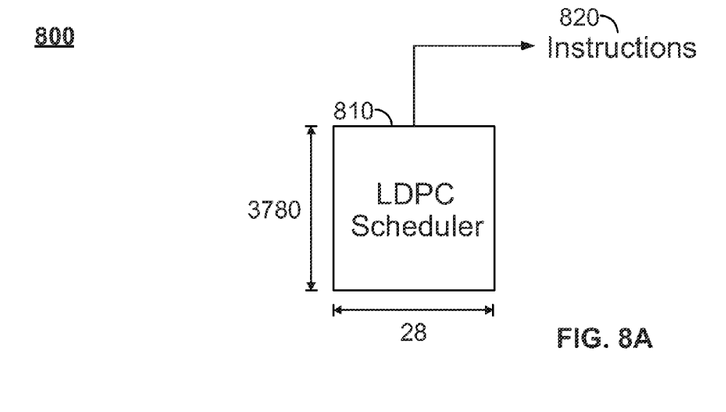
FIGS. 8A and 8B show two different structural implementations of an LDPC scheduler in accordance with some arrangements.
Figure 8B:
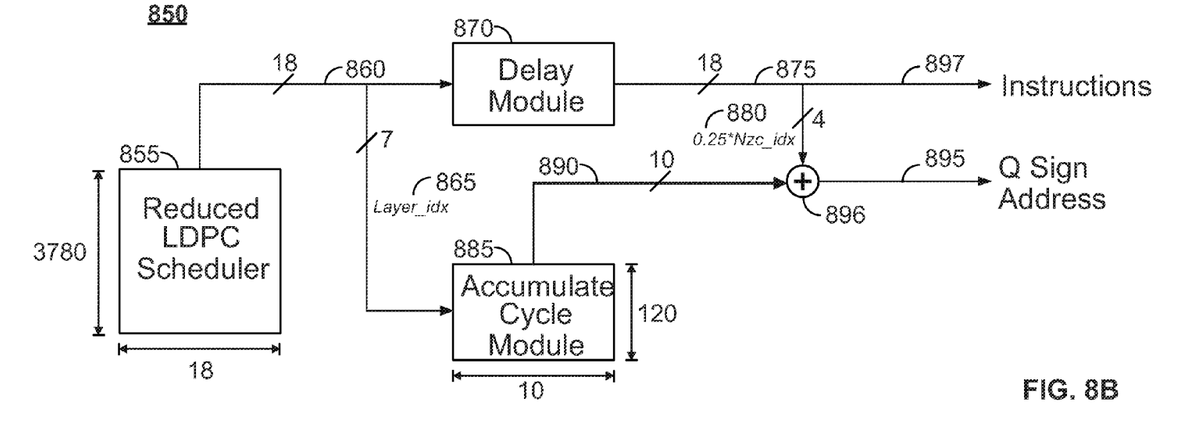

FIGS. 8A and 8B show two different structural implementations of an LDPC scheduler in accordance with some arrangements. In particular, each of structural depiction 800 and structural depiction 850 illustrate an implementation of an LDPC scheduler that may correspond to a more detailed arrangement of LDPC scheduler 710 (FIG. 7)

In an arrangement, LDPC scheduler 710 (FIG. 7) stores all of the instructions described above (i.e., h_edge 718, nzc_idx 714 (or alternatively, the value nzc_idx/4), qs_mem_addr 732, shift 716, and layer_idx 712) in a continuous rectangular block of memory. This arrangement is depicted by LDPC scheduler 810, which stores all of the instructions described above, resulting in 28 bits of storage per layer of parity check matrix H 125 (FIGS. 1-4 and 6). The data storage format of a layer using LDPC scheduler 810 in this arrangement is given by

TABLE 1

| Bits 27:26 | Bits 25:22 | Bits 21:12 | Bits 11:7 | Bits 6:0 |
|---|---|---|---|---|
| H_edge | Nzc_idx/4 | Qs_mem_addr | Shift | Layer_idx |

Further, if parity check matrix H 125 (FIGS. 1-4 and 6) has 3780 (or fewer) layers, then LDPC scheduler 810 can be implemented using 3780×28 Bits of memory storage in a continuous memory block as depicted in structural depiction 800. In an arrangement, LDPC scheduler 810 transmits instructions 820 during a given clock cycle, where the instructions sent during the clock cycle correspond to a given layer of parity check matrix H 125 (FIGS. 1-4 and 6) (i.e., in a given clock cycle instructions 820 are transmitted in the 28-bit format as shown in Table 1).

Structural depiction 850 represents an alternate implementation of LDPC scheduler 710 (FIG. 7) that, in comparison with LDPC scheduler 810 (FIG. 8A), may operate with lower power requirements and/or save memory costs (by using memory that occupies a smaller area). In particular, data storage is performed with two memory blocks (i.e., with one memory block within reduced LDPC scheduler 855 and with another memory block represented by accumulate cycle module 885) as depicted in FIG. 8B and as described by the following tables

TABLE 2

| Bits 17:16 | Bits 15:12 | Bits 11:7 | Bits 6:0 |
|---|---|---|---|
| Y_edge | Nzc_idx/4 | Shift | Layer_idx |

TABLE 3

| Bits 9:0 |
|---|
| QS_base_mem_addr | where Table 2 represents the data storage format of a layer employed by reduced LDPC scheduler 855, and Table 3 represents the data storage format of a layer employed by accumulate cycle module 885.

Thus, in an arrangement, reduced LDPC scheduler 855 may store all of the quantities described in Table 2, above, resulting in 18 bits of storage per layer of parity check matrix H 125 (FIGS. 1-4 and 6). Further, if parity check matrix H 125 (FIGS. 1-4 and 6) has 3780 (or fewer) layers, then the data of reduced LDPC scheduler 855 can be stored in the manner shown by structural depiction 850, where reduced LDPC scheduler 855 includes 3780×18 bits of memory storage in a continuous memory block. Thus, as shown by line 860, each instruction of reduced LDPC scheduler 855, sent during a given clock cycle, is 18 bits wide.

As shown in Table 3, above, accumulate cycle module 885 stores a base address for each 10-bit Q sign memory corresponding to a layer of parity check matrix H 125 (FIGS. 1-4 and 6), stored in a memory block at accumulate cycle module 885 that is 120×10 bits wide. Further, accumulate cycle module 885 computes a Q sign memory address in real-time (i.e., rather than based on retrieving this information directly from storage) by using layer_idx 865 as well as a corresponding value of a Q sign memory address stored in accumulate cycle map 885. The resulting 10-bit output from accumulate cycle module 885 is passed to adder 896 where it is combined (i.e., added) to the value of nzc_idx/4 880. The output of adder 896 is the desired value, Q Sign Address (i.e., corresponding to the layer of parity check matrix H 125 (FIGS. 1-4 and 6) that is currently being processed). The instructions conveyed by line 860 of reduced LDPC scheduler 855 are passed through delay module 870 to line 875 and to line 897.

The above described arrangements and embodiments are presented for the purposes of illustration and not of limitation. For example, the described techniques may be performed without storage of one or more variables produced by a SOVA detector. Further, one or more parts of techniques described above may be performed in a different order (or concurrently) and still achieve desirable results. In addition, the techniques of the disclosure may be implemented in hardware, such as on an application specific integrated circuit (ASIC) or on a field-programmable gate array (FPGA). The techniques of the disclosure may also be implemented in software, or in a combination of hardware and software.

What is claimed is:

1. A method for decoding a vector received from a communications channel using a non-binary decoder, the method comprising:
computing a plurality of R messages corresponding to a variable node of the non-binary decoder using a message passing process;
forming decoder extrinsic information for the variable node by combining the plurality of R messages; and
providing the decoder extrinsic information to a soft-detector.

2. The method of claim 1, wherein combining the plurality of R messages comprises linearly weighing the plurality of R messages based on inverse coefficients from a parity check matrix representation of a code used by the non-binary decoder.

3. The method of claim 1, wherein the soft-detector outputs the detector extrinsic information and wherein the combining is performed without accessing memory storing the detector extrinsic information.

4. The method of claim 1, wherein the non-binary decoder is an LDPC decoder.

5. The method of claim 1, wherein forming the decoder extrinsic information is performed using a layered decoding approach.

6. The method of claim 1, wherein the computing is performed based on a Tanner graph representation of an LDPC code.

7. The method of claim 1, wherein the message passing process is selected from the group consisting of a min-sum decoding process and a sum-product decoding process.

8. The method of claim 1, wherein the decoder extrinsic information is combined with detector extrinsic information to form updated channel information, and wherein the updated channel information is provided to the non-binary decoder to update the message passing process.

9. The method of claim 1, wherein forming the decoder extrinsic information comprises converting the decoder extrinsic information from a symbol metric representation to an error metric representation.

10. The method of claim 1, wherein forming the decoder extrinsic information comprises accessing R memory and Q sign memory, wherein the R memory and the Q sign memory are stored inside the non-binary decoder.

11. The method of claim 1, wherein the decoder extrinsic information is interleaved prior to being provided to the soft-detector.

12. The method of claim 1, wherein forming the decoder extrinsic information comprises generating a Q sign memory address in real-time.

13. The method of claim 12, wherein generating the Q sign memory address comprises:
retrieving, from a memory location, a base address corresponding to the Q sign memory address; and generating the Q sign memory address based, at least in part, on the base address.

14. The method of claim 12, wherein the base address is retrieved from a plurality of base addresses based on a layer index value.

15. A device for decoding a vector received from a communications channel, the device comprising:
- a non-binary decoder configured to:
  - compute a plurality of R messages corresponding to a variable node of the non-binary decoder using a message passing process; and
  - form decoder extrinsic information for the variable node by combining the plurality of R messages; and
- a soft-detector configured to receive the decoder extrinsic information.

16. The device of claim 15, wherein the non-binary decoder is further configured to combine the plurality of R messages by linearly weighing the plurality of R messages based on inverse coefficients from a parity check matrix representation of a code used by the non-binary decoder.

17. The device of claim 15, wherein:
- the soft-detector is further configured to output the detector extrinsic information; and
- the non-binary decoder is further configured to perform the combining without accessing memory storing the detector extrinsic information.

18. The device of claim 15, wherein the non-binary decoder is an LDPC decoder.

19. The device of claim 15, wherein the non-binary decoder is further configured to form the decoder extrinsic information using a layered decoding approach.

20. The device of claim 15, wherein forming the decoder extrinsic information comprises generating a Q sign memory address in real-time.

* * * * *